United States Patent
Hackler, Sr. et al.

(10) Patent No.: US 9,082,881 B1
(45) Date of Patent: Jul. 14, 2015

(54) SEMICONDUCTOR ON POLYMER SUBSTRATE

(71) Applicants: Douglas R. Hackler, Sr., Boise, ID (US); Richard L. Chaney, Meridian, ID (US)

(72) Inventors: Douglas R. Hackler, Sr., Boise, ID (US); Richard L. Chaney, Meridian, ID (US)

(73) Assignee: American Semiconductor, Inc., Boise, ID (US)

( * ) Notice: Subject to any disclaimer, the term of this patent is extended or adjusted under 35 U.S.C. 154(b) by 37 days.

(21) Appl. No.: 13/936,937

(22) Filed: Jul. 8, 2013

Related U.S. Application Data

(63) Continuation-in-part of application No. 13/242,376, filed on Sep. 23, 2011, now abandoned.

(60) Provisional application No. 61/389,652, filed on Oct. 4, 2010.

(51) Int. Cl.
  *H01L 23/48* (2006.01)
  *H01L 21/84* (2006.01)
  *H01L 29/02* (2006.01)

(52) U.S. Cl.
  CPC ............... *H01L 21/84* (2013.01); *H01L 29/02* (2013.01)

(58) Field of Classification Search
  CPC ............... H01L 2924/00; H01L 2221/68359; H01L 2924/01006; H01L 2924/01033; H01L 25/50; H01L 2924/01005; H01L 2221/68363; H01L 2221/68368
  USPC ................... 257/E21.705, E29.295, E25.021, 257/E23.065, E23.177, 347, E21.122, 257/E21.32, E21.214
  See application file for complete search history.

(56) References Cited

U.S. PATENT DOCUMENTS

| | | | |
|---|---|---|---|
| 5,258,325 A | 11/1993 | Spitzer et al. | |
| 5,376,561 A | 12/1994 | Vu et al. | |
| 5,377,031 A | 12/1994 | Vu et al. | |
| 5,656,552 A * | 8/1997 | Hudak et al. | 438/15 |
| 6,027,958 A | 2/2000 | Vu et al. | |
| 6,640,432 B1 | 11/2003 | Mathieu et al. | |
| 6,741,085 B1 | 5/2004 | Khandros et al. | |
| 6,762,510 B2 * | 7/2004 | Fock et al. | 257/787 |
| 6,967,494 B2 | 11/2005 | Kline | |
| 7,274,413 B1 * | 9/2007 | Sullivan et al. | 349/43 |
| 2004/0142118 A1 * | 7/2004 | Takechi | 428/1.6 |

* cited by examiner

*Primary Examiner* — David Vu
*Assistant Examiner* — Jonathan Han
(74) *Attorney, Agent, or Firm* — Your Intellectual Property Matters, LLC; Robert A. Frohwerk

(57) ABSTRACT

Semiconductor On Polymer (SOP) is a flexible ultra-thin substrate that can be used as the starting material for CMOS, MEMS or Complex Interconnects such as an interposer. The described process results in a flexible SOP device with open bond pads. After deposition of a liquid polymer onto a semiconductor substrate, the polymer is converted to a solid, creating a new substrate that is temporarily bonded to a carrier wafer. The semiconductor layer is then etched to be ultra-thin and highly uniform, specifically, a single crystalline silicon layer. Following fabrication of devices and interconnects on the polymer substrate, the ultra thin wafer is released from the carrier wafer in substrate form to be used whole or tiled for subsequent assembly. Among other advantages, the flexible format of the SOP substrate enables low resistance 3-D interconnects, and provides for a significant increase in performance due to a reduction in parasitic capacitance.

17 Claims, 11 Drawing Sheets

US 9,082,881 B1

SEMICONDUCTOR ON POLYMER SUBSTRATE

CROSS-REFERENCES TO RELATED APPLICATIONS

This application is a Continuation-In-Part of co-pending U.S. patent application Ser. No. 13/242,376 filed on Sep. 23, 2011, entitled "Semiconductor on Polymer Substrate", which is incorporated here by reference in its entirety, and which claimed benefit of U.S. Provisional Application No. 61/389,652 filed Oct. 4, 2010.

FIELD OF THE INVENTION

The present invention relates generally to a process for manufacturing semiconductor devices. In particular, the devices produced by the described process are integrated circuits constructed on a flexible substrate.

BACKGROUND OF THE INVENTION

As microelectronic circuits become ever more dense in an attempt to accommodate the growing demand to pack greater functionality into smaller packages, newer techniques are required. Much of the advancement in packaging technology is driven by the market for mobile devices. One approach to high density packaging is to fabricate ultra-thin devices that are exceptionally flexible. The resulting flexible circuits may span dimensions up to several centimeters but with thicknesses of no more than a few microns. One common use for such flexible components is as an interposer, a device that is used as an interface to provide interconnections between two or more integrated circuits to produce a stacked three-dimensional structure. As the dimensions of flexible circuits expand, they may provide interconnections for more and more individual IC's toward develop of ever more complex systems.

BRIEF DESCRIPTION OF THE DRAWINGS

The particular features and advantages of the invention will become apparent from the following description taken in conjunction with one or more of the accompanying FIGS. 1-6 of the drawings.

Figure 1:
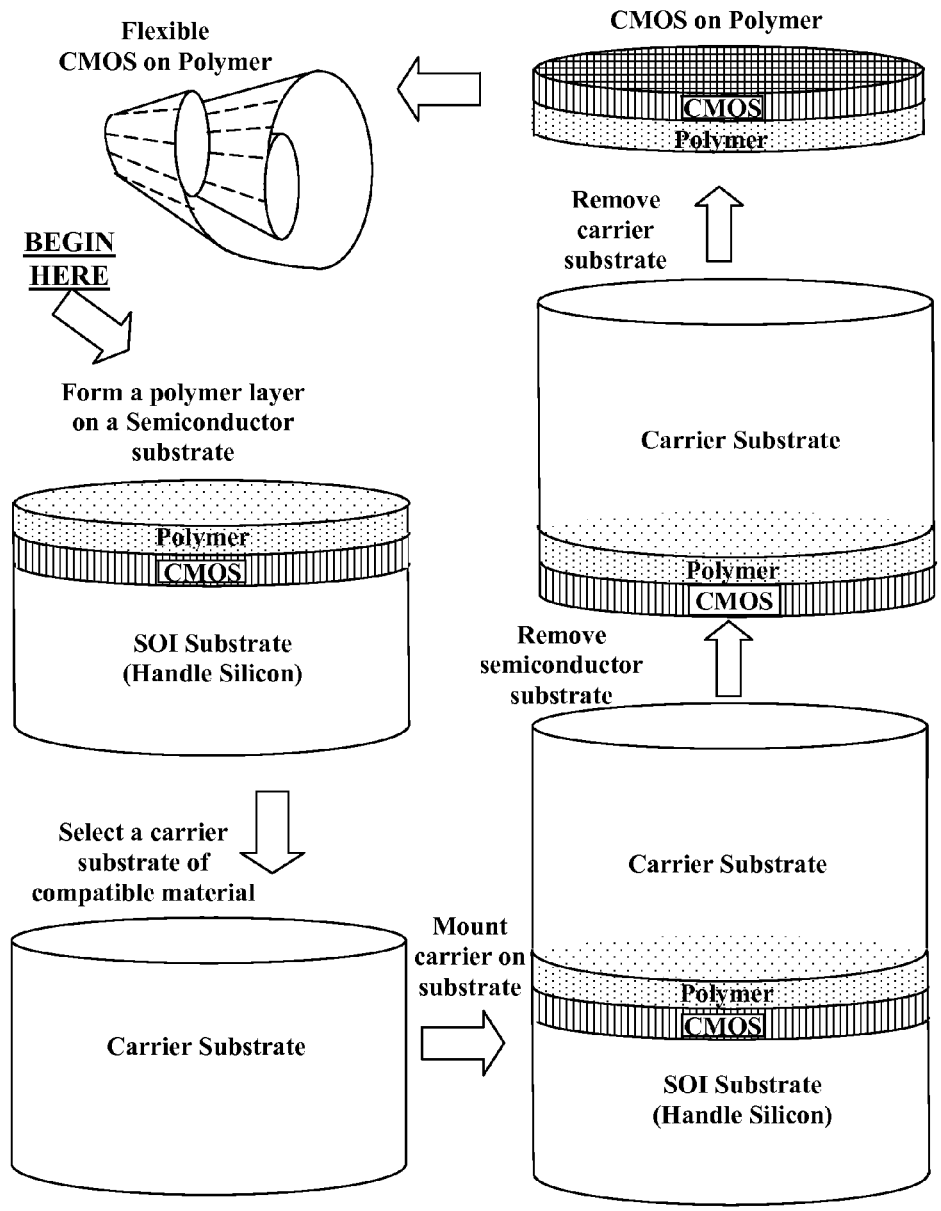
FIG. 1 is a pictorial diagram of the flow of a presently described process to produce a flexible circuit.

The following Reference Numbers may be used in conjunction with one or more of the accompanying FIGS. 1-7 of the drawings:

100 SOP device
110 Silicon wafer, semiconductor substrate, initial
115 Semiconductor substrate, thinned
120 Polymer, liquid
125 Polymer, solidified
130 Carrier wafer
135 Temporary polymer
140 Bonding material, adhesive
150 Fabricated devices
155 Bonding Pad
160 Polymer, liquid
165 Polymer, solidified 180 Bonding oxide
200 Flexible SOP
210 Silicon wafer, final
220 SOP bonded to a silicon wafer

DETAILED DESCRIPTION OF THE INVENTION

The presently described process applies to VLSI (Very Large-Scale Integrated) circuits to produce Semiconductors on a Polymer (SOP) substrate. The described process uses transfer techniques which include coating of the VLSI circuit with a polymer and the removal of the VLSI circuit from its initial silicon wafer. The process allows the polymer coating to cover all surfaces of the VLSI circuit, except bond pads which are passivated with protective coatings. The resulting circuit components are sufficiently flexible that they may be used in roll-to-roll (R2R) production, and/or stacked into three-dimensional structures. The flexible ultra-thin substrate can be used as the starting material for CMOS (Complementary Metal-Oxide-Semiconductor), MEMS (Micro-Electro-Mechanical Systems) or Complex Interconnects such as an interposer.

Figure 2:
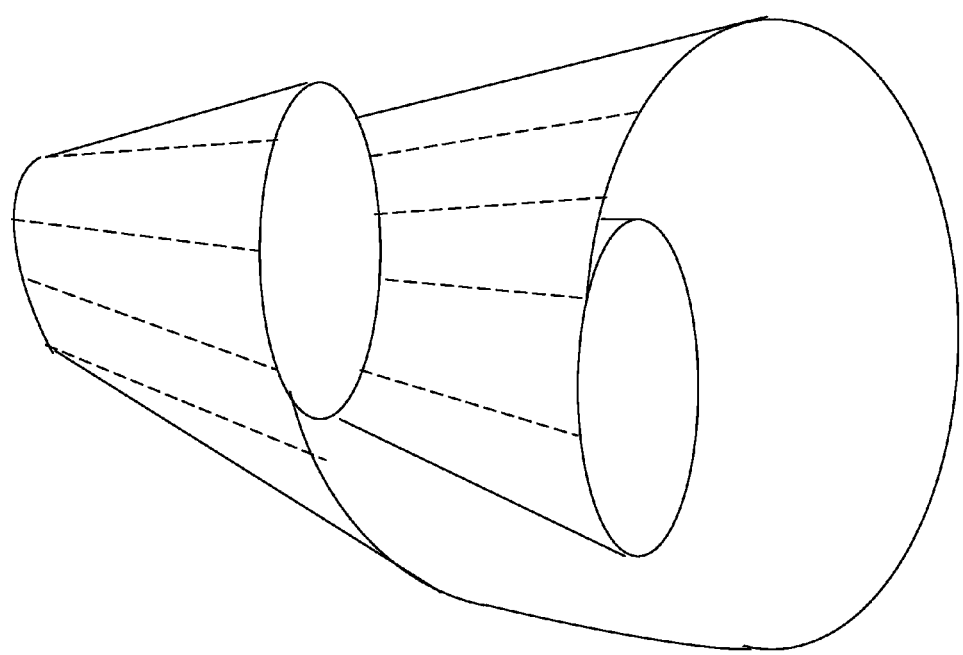
FIG. 2 illustrates a sheet of flexible circuitry as produced by a presently described process.

A high-level flow diagram of the SOP process is shown pictorially in FIG. 1. Beginning with any SOI (Silicon on Insulator) wafer, a polymer is overlaid onto the SOI layer, which for purposes of illustration will have been fabricated as CMOS devices. The polymeric surface is then attached to a Carrier Substrate. With support from the carrier, the initial SOI substrate is thinned by removal of material, after which the carrier is removed by separation. This leaves the ultra-thin CMOS on a highly flexible polymer substrate. FIG. 2 illustrates a sheet of flexible semiconductor devices produced as a result of the described process.

A more detailed view of the process flow is provided in FIGS. 3A-3G. In one embodiment, the starting material is a conventional silicon wafer (110, FIG. 3A). This substrate may be a blank semiconductor wafer, or it may be preprocessed. If the latter, it may include interconnects, and may be with or without active or passive devices. Since the steps which follow are to be executed at relatively low temperatures, the wafer may have extensive multi-layer metal CMOS devices fabricated on it.

Figure 3A:
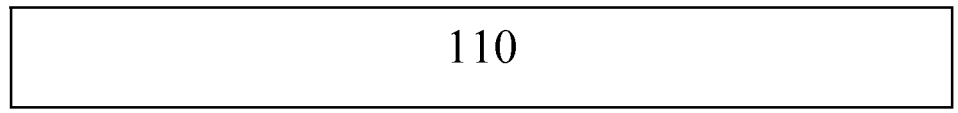
FIGS. 3A-3G show details of a process flow for fabrication of devices as Semiconductor on Polymer (SOP)
Figure 3B:
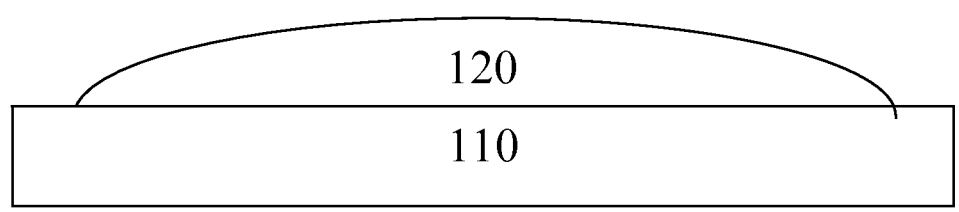
Figure 3C:
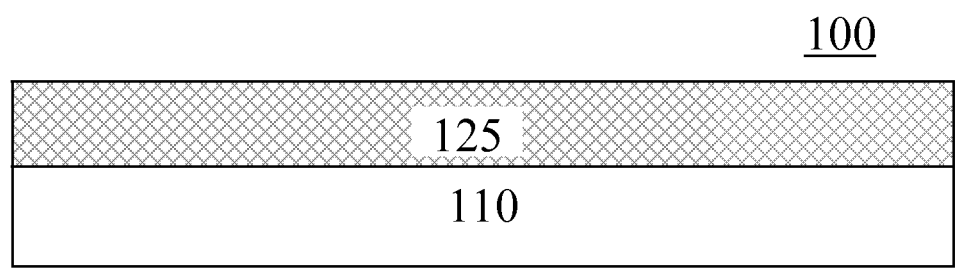
Figure 3D:
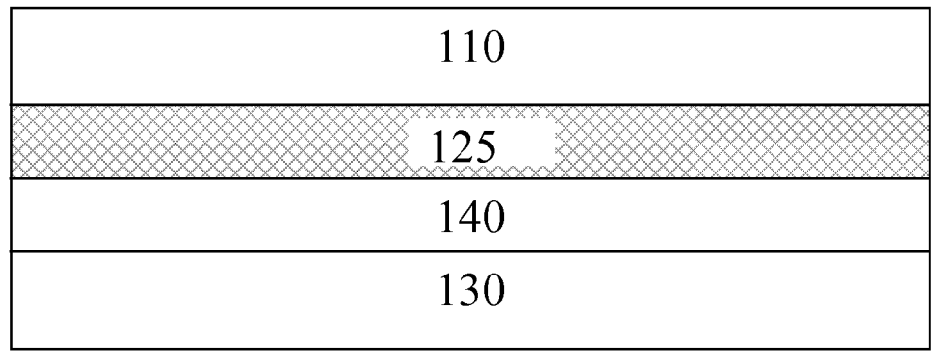

Onto this starting material a liquid polymer 120 is deposited, as shown in FIG. 3B. Deposited as a liquid, the polymer 120 serves to planarize the surface, conforming to topography and non-uniformities in the initial semiconductor surface. In U.S. Pat. No. 6,027,958 for "Transferred Flexible Integrated Circuit", hence forth the '958, Vu et al. describe a process of bonding integrated circuits to a separately formed solid polymer substrate in order to gain flexibility. That process applies only to SOI structures. In contrast to that approach, the presently described process, using a liquid polymer, achieves greater conformance without requiring an additional layer to encapsulate the semiconductor surface and is not restricted to SOI. This facilitates increased flexibility of devices produced by the present process.

The liquid polymer 120 (FIG. 3B) is then converted (FIG. 3C) to a solidified polymer 125 for use as a substrate. The conversion of the polymer from a liquid to a solid state is accomplished by methods specific to the given polymer that are known to those skilled in such arts. This conversion results in a solid whereby the polymer becomes a new flexible substrate that will provide mechanical support, strength and stability in the end-product. It is important to note that while deposited polymers, such as polymide, are commonly used as protective overcoats they have not been used in the capacity of a mechanical substrate.

With the newly applied polymer substrate in place, the combined unit (110 with 125) is inverted (FIG. 3D) and temporarily bonded to a carrier wafer 130 by means of an adhesive 140 to produce an intermediate assembly. Since the wafer fabrication industry does not recognize polymer as an option for a substrate, the bonding of a polymer as substrate to a carrier wafer is a new concept. The temporary mounting of the conventional silicon wafer 110 supported by the solidified polymer substrate 125 onto the carrier wafer 130 provides mechanical stability for further processing. From among many suitable carrier substrates, silicon, borosilicate glass or quartz are preferred though other materials are acceptable.

It is known in the semiconductor device fabrication industry that silicon readily fractures at room temperature whereas metals are typically subject to inelastic deformation, that is, once deformed they do not return to their original form. For this reason, the crystalline materials used for integrated circuits, such as silicon and gallium arsenide (GaAs), are not common choices for flexible semiconductor circuit applications. One approach that has been used in the past to overcome this problem in order to provide flexibility to circuits is to limit the size of individual chips and to place them onto a flexible substrate with sufficient spacing between them to allow the alternate substrate to enable flexion between the chips. This limitation is overcome by the presently described method to allow for the fabrication of relatively continuous circuits. The method described here allows for incorporation of a single crystalline semiconductor material into a polymer substrate.

It is known that thin films of semiconductor material are sufficiently flexible to enable fabrication of continuous circuitry; however, the problem has been a failure to recognize suitable substrates that are at once capable of providing sufficient support while themselves remaining flexible. Semiconductor materials that are no more than 100 μm (microns) thick, and preferably closer to, or less than, 10 μm thick, are capable of supporting circuit elements with surface dimensions of less than 100 μm and maintaining circuit integrity when bent to a radius of curvature as small as 2.54 cm (1-inch). Other developers in the industry have described techniques (such as in U.S. Pat. No. 6,027,958 to Vu et al.) that target a minimum radius of curvature of at least 10 inches (25.4 cm) which has been considered sufficient to provide the desired flexibility for many applications. The presently described method is capable of achieving a bending radius tighter than ½-inch (1.27 cm).

Figure 3E:
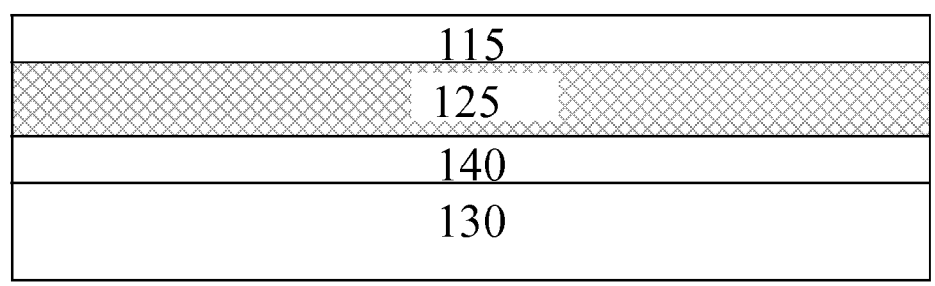

Turning now to FIG. 3E, the initial semiconductor substrate 110 is thinned to less than 12 μm resulting in the thinned semiconductor substrate 115. This thinning operation is made possible with the support of the solidified polymer substrate 125 laminated upon the carrier wafer 130 in the intermediate assembly. This extreme thinning is accomplished by a process that begins with traditional mechanical grinding down to approximately 50 μm. Then an isotropic etch is applied that utilizes the crystal orientation of the silicon to create an ultra-thin and highly uniform semiconductor layer. Though other methods are capable of thinning semiconductor materials to less than 12 μm, this method using an isotropic etch is preferred for its reliability.

Figure 3F:
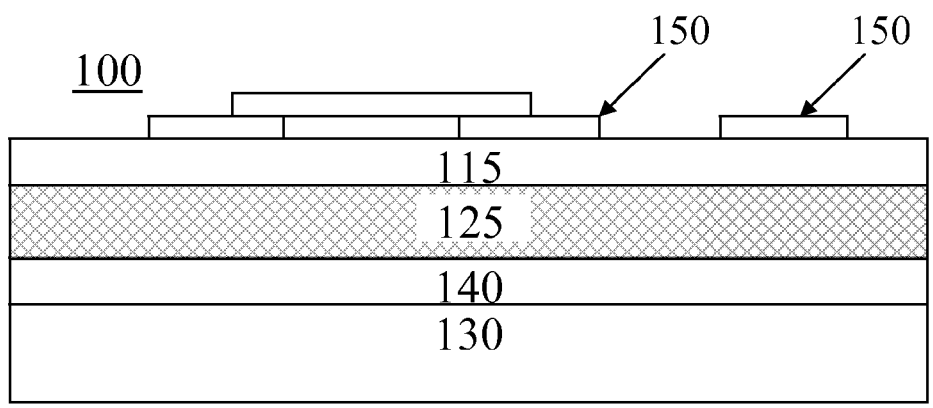
Figure 3G:
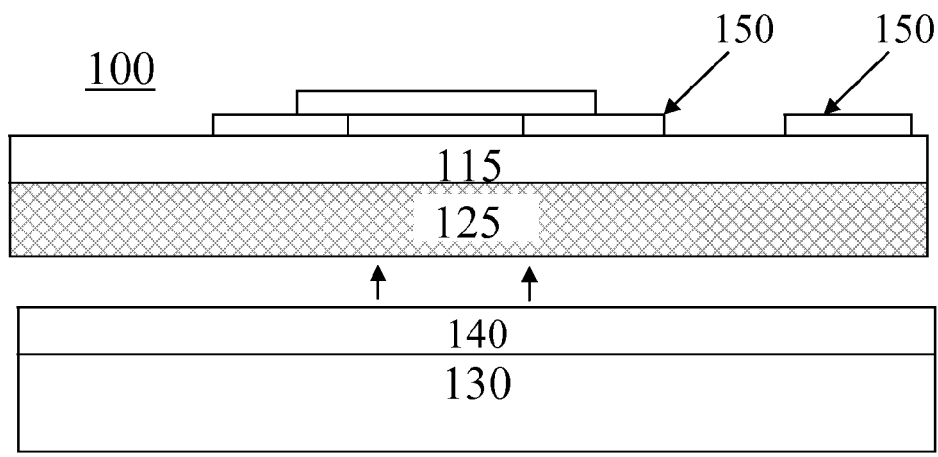

Though ultra-thin, the single crystalline silicon, supported by the carrier wafer 130, is available for additional fabrication, as depicted in FIG. 3F. This optional step allows for the addition of complex integrated active devices, passive devices and interconnects 150. These may use semiconductor, dielectric, metal and metal-like materials. Post-thinning processing may include direct-write technologies such as those using electronic inks. This fabrication of devices and interconnects on a polymer substrate integrating single crystalline silicon has previously not been a viable option.

While single crystalline silicon is the preferred material for direct application on the polymer, other semiconductors or poly-silicon may be used. Alternatively, non-semiconductor materials such as dielectrics and metals may also be used, for example, for the formation of MEMS (Micro-Electro-Mechanical Systems) devices, flexible interconnects or interposers.

Following any additional fabrication the ultra-thinned substrate 115 is released (FIG. 3G) from its carrier wafer 130 by breaking the bond between the adhesive 140 and the solidified polymer 125. This release leaves the ultra-thinned substrate 115 fully intact in substrate, or wafer, form so that it may be used for further assembly in its entirety as a flexible whole semiconductor wafer where an entire substrate surface can be used as a single device. Alternately, the ultra-thinned wafer may be separated into smaller units, as by singulation or tiling, to be used as individual flexible semiconductor devices. Singulated SOP devices may be applied to enhance products of a roll-to-roll (R2R) process.

A previous approach, such as that of '958, required the inclusion of a separation layer or etch stop, such as a film of copper or another metal or silicon, between the substrate and the adhesive layer. Since the separation layer was not applied completely to the edge of the wafer, the entire wafer was not releasable. This meant that individual die were not flexible until they were released from the transfer substrate which required dicing, or singulation, whereas the presently described process provides flexibility to full wafers without any need to dice them.

Whether in wafer form or as flexible semiconductor chips, removal of the handle silicon by the presently described process produces ultra-thin devices that exhibit a significant reduction of the parasitic capacitance at the interface between the BOX (Buried OXide layer) and the handle silicon. This elimination of the handle silicon creates what has been referred to in the literature as "Silicon on Nothing" (SON). This reduction of parasitic capacitance enables a significant increase in performance for devices produced by these methods.

Figure 4A:
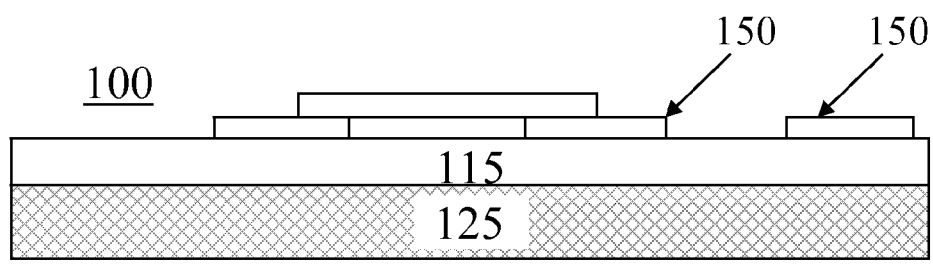
FIG. 4A depicts an intermediate product of a described process which includes post-thinning fabrication.
Figure 4B:
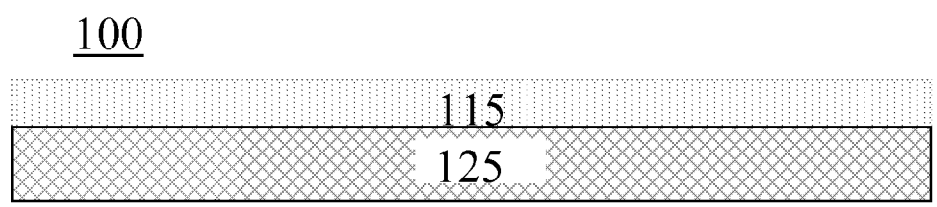
FIG. 4B shows an assembly that is an intermediate product of a described process that is not subjected to post-thinning fabrication.
Figure 5:
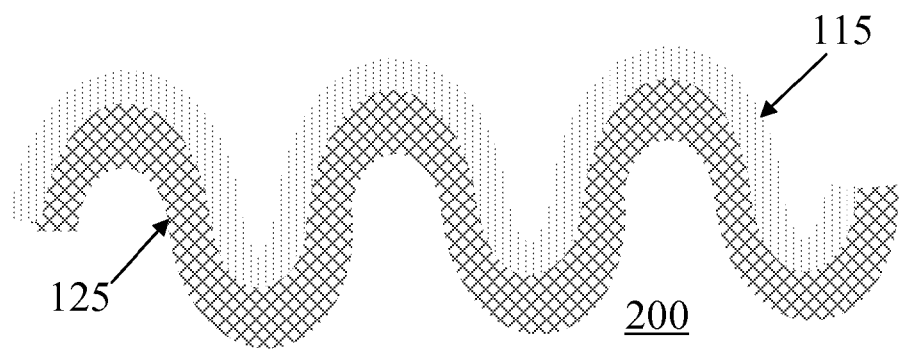
FIG. 5 illustrates the flexibility achieved by ultra-thin SOP substrates.

The resultant SOP (Semiconductor on Polymer) is shown in FIG. 4A for those instances which include post-thinning fabrication, whereas assemblies that are not subjected to post-thinning fabrication are depicted in FIG. 4B. The flexibility achieved by the ultra-thin SOP substrates is suggested by the illustration of FIG. 5. Such flexibility results in improved durability and resistance to breakage while allowing SOP products to be applied to curved or flexing surfaces.

Figure 6:
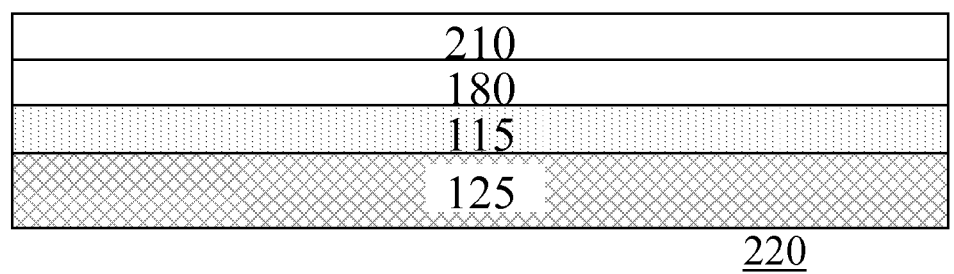
FIG. 6 shows a step in a fabrication process where an oxide to oxide bond is used to bond SOP to a silicon wafer.

As appropriate to system requirements of the circuits fabricated as SOP, the SOP of FIG. 4A or FIG. 4B may be bonded to a wafer 210 of silicon or other material as shown in FIG. 6 using a bonding oxide 180. This oxide to oxide bond as used in the presently described SOP process is preferred over the adhesive bond required by the double transfer method of the '958.

The technique described above works well where it is desired that the resultant flexible circuitry be protected or encapsulated. In some situations it may be preferred that the bond pads on the first surface remain open to allow for external electrical connectivity. Applying the following methodology will accomplish this goal.

Figure 7A:
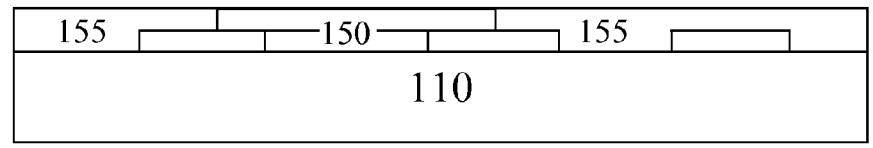
FIGS. 7A-7K show details of a process flow for fabrication of devices as Semiconductor on Polymer that leaves bond pads open.
Figure 7B:
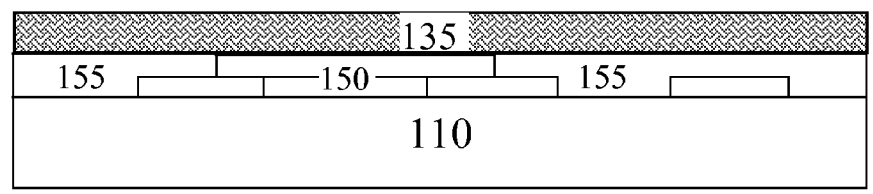
Figure 7C:
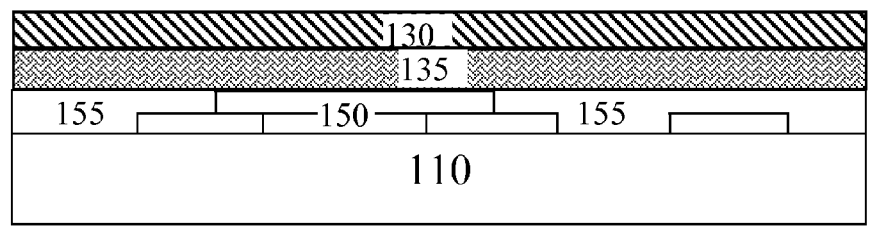
Figure 7D:
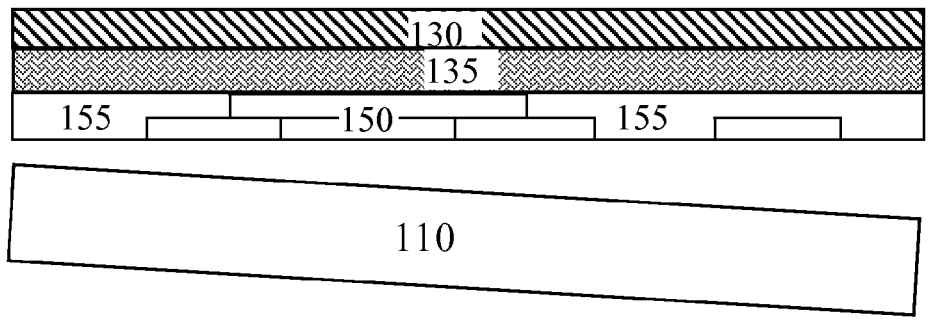
Figure 7E:
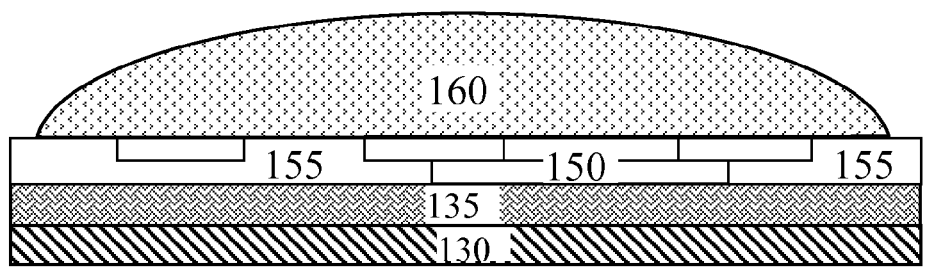
Figure 7F:
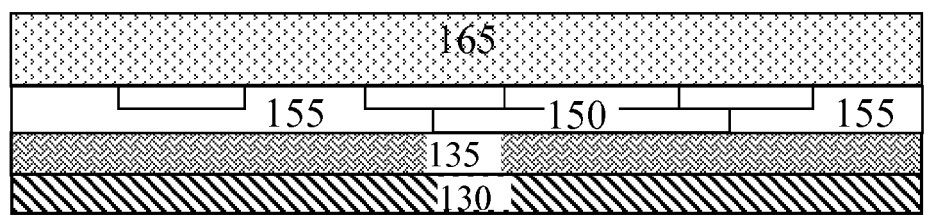
Figure 7G:
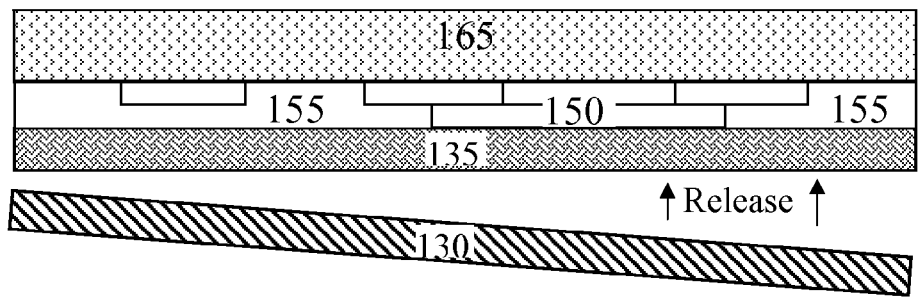
Figure 7H:
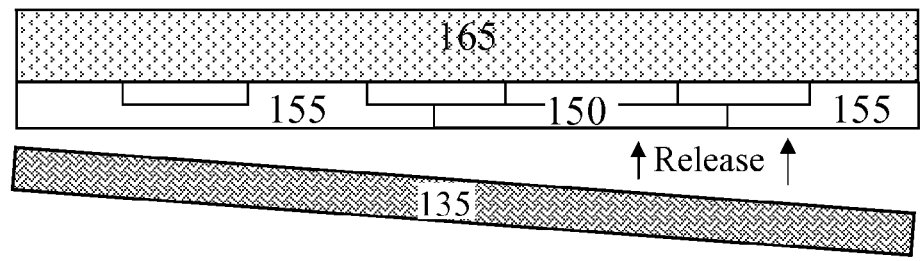

A detailed view of an alternate process flow is provided in FIGS. 7A-7K. At FIG. 7A a semiconductor substrate serving as a handle wafer 110 is shown with fabricated devices 150 and bond pads 155 on a first surface. A temporary polymer 135, serving as an adhesive, is deposited in FIG. 7B to cover the entire surface. A carrier substrate 130 is attached to the temporary polymer 135 in FIG. 7C for use as a temporary substrate. With this alternate means of support in place, the initial substrate handle 110 can be removed (FIG. 7D). In process steps similar to those described in relation to FIG. 3, a second liquid polymer 160 is applied in FIG. 7E and solidified to a solid polymer 165 in FIG. 7F.

Figure 7I:
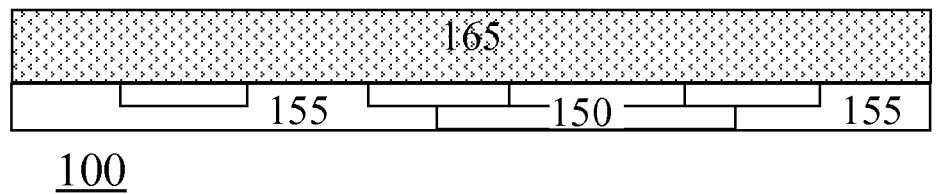
Figure 7J:
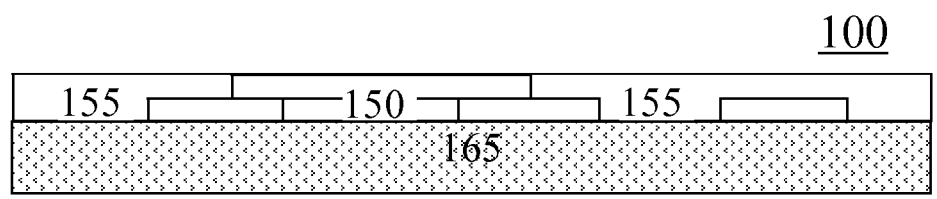
Figure 7K:
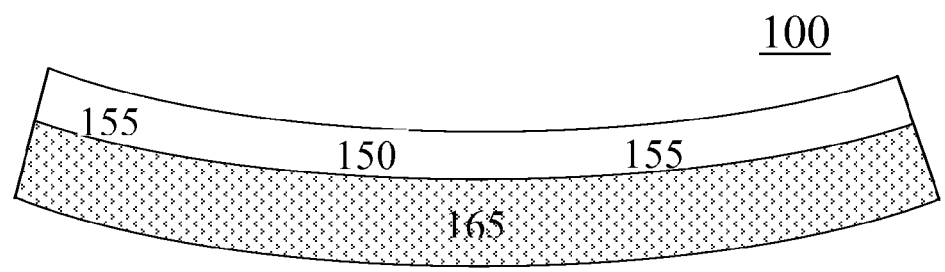

Support from the solid polymer 165 allows for release (FIG. 7G) of the carrier substrate 130. The temporary polymer, acting as an adhesive, is removed at FIG. 7H to expose the first surface with open bond pads as shown in FIG. 7I. Reorienting the assembly to place the first surface at the upper position in FIG. 7J gives the same appearance as in FIG. 7A, except that the initial semiconductor substrate which served as a handle 110 has been replaced by a flexible polymer 165. Flexibility of the Semiconductor on Polymer (SOP) device is depicted in FIG. 7K except that, unlike the previously described process described with respect to FIG. 3, the bond pads at the first surface are now open.

Whether bonded to a semiconductor substrate or left in its more flexible format as a free-standing SOP, devices fabricated in this manner can be implemented in multiple layers and stacked for highly complex systems with interconnects and devices, active or passive, fabricated within the layers prior to being stacked.

The SOP substrate may be singulated, from tiles, into a variety of two-dimensional geometric shapes, whereas singulation and assembly of a flexible semiconductor wafer after release from the carrier, or handle, wafer has not been practiced in the industry prior to the techniques described here. Post-release singulated devices or entire flexible semiconductor substrates may be assembled like postage stamps on an envelope.

Although the preferred use of the SOP process is to produce flexible CMOS, the described technique can be used to create a wide variety of other flexible systems derived from micro-fabricated structures in a flexible format. Devices having low resistance three-dimensional interconnects may be fabricated by using through-vias in the SOP.

While the present invention has been described with respect to certain embodiments, there is no implication to restrict the present invention to preclude other implementations, some of which have been briefly touched upon as well as others that will be apparent to those skilled in the related arts. Therefore, it is not intended that the invention be limited to the disclosed embodiments or to the specifically described details insofar as variations can be made within the spirit and scope of the appended claims.

What is claimed is:

1. A method for producing a flexible semiconductor device, the method comprising the steps of:
    acquiring a semiconductor substrate having a first surface, a thickness and a second surface,
    wherein the second surface is opposite the thickness from the first surface;
    applying a temporary polymer onto the first surface of the semiconductor substrate;
    bonding a carrier substrate to the temporary polymer to produce an intermediate assembly;
    supporting the intermediate assembly at the carrier substrate;
    thinning the semiconductor substrate by removal of material beginning at the second surface;
    depositing a liquid polymer onto the second surface of the semiconductor substrate;
    converting the liquid polymer to a solidified permanent polymer;
    releasing the bond between the carrier substrate and the temporary polymer; and
    removing the temporary polymer from an entirety of the first surface of the semiconductor substrate,
    wherein the entirety of the first surface remains open, and whereby a flexible semiconductor device is produced.

2. The method of claim 1, wherein depositing the liquid polymer applies to an entirety of the second surface of the semiconductor substrate.

3. The method of claim 1, wherein the temporary polymer is an adhesive.

4. The method of claim 1, wherein the bonding includes a bonding oxide.

5. The method of claim 1, wherein the thinning comprises mechanical grinding.

6. The method of claim 1, wherein the thinning comprises an isotropic etch.

7. The method of claim 1, wherein the thinning comprises mechanical grinding to reduce the thickness of the semiconductor substrate to less than about 50 μm; and
    isotropic etching to further reduce the thickness of the semiconductor substrate to less than about 12 μm.

8. The method of claim 1, further comprising additional fabrication to the second surface following the step of thinning prior to the step of depositing a liquid polymer onto the second surface.

9. The method of claim 8, wherein the additional fabrication may use materials that are semiconductor, dielectric, metal and/or metal-like.

10. The method of claim 8, wherein the additional fabrication may include components from a set which includes active devices, passive devices and interconnects.

11. The method of claim 1, wherein the semiconductor substrate is preprocessed to include components from a set which includes active devices, passive devices and interconnects.

12. The method of claim 1, wherein the semiconductor substrate is preprocessed to include multi-layer metal CMOS devices.

13. The method of claim 1, wherein the semiconductor substrate is single crystalline silicon.

14. The method of claim 1, wherein a surface of the semiconductor substrate is oxide remaining from an SOI wafer subsequent to thinning the semiconductor substrate.

15. The method of claim 1, wherein the first surface is passivated.

16. A method for producing a flexible semiconductor device, the method comprising the steps of:
    acquiring a semiconductor substrate having a first surface, a thickness and a second surface, wherein the second surface is opposite the thickness from the first surface;
    applying a temporary polymer onto the first surface of the semiconductor substrate;
    bonding a carrier substrate to the temporary polymer to produce an intermediate assembly;

supporting the intermediate assembly at the carrier substrate;

thinning the semiconductor substrate by removal of material beginning at the second surface;

applying a permanent polymer to the second surface of the semiconductor substrate;

releasing the bond between the carrier substrate and the temporary polymer; and removing the temporary polymer from an entirety of the first surface of the semiconductor substrate, wherein the entirety of the first surface remains open, and whereby a flexible semiconductor device is produced.

17. The method of claim 16, further comprising additional fabrication to the second surface following the step of thinning prior to the step of applying a permanent polymer to the second surface.

* * * * *